United States Patent
Joshi et al.

(10) Patent No.: US 10,963,615 B1
(45) Date of Patent: Mar. 30, 2021

(54) DATA PROCESSING ENGINE (DPE) ARRAY ROUTING

(71) Applicant: Xilinx, Inc., San Jose, CA (US)

(72) Inventors: Abhishek Joshi, San Jose, CA (US); Grigor S. Gasparyan, San Jose, CA (US)

(73) Assignee: XILINX, INC., San Jose, CA (US)

( * ) Notice: Subject to any disclaimer, the term of this patent is extended or adjusted under 35 U.S.C. 154(b) by 76 days.

(21) Appl. No.: 16/399,445

(22) Filed: Apr. 30, 2019

(51) Int. Cl.
| | | |
|---|---|---|
| *G06F 30/394* | (2020.01) | |
| *H03K 19/1776* | (2020.01) | |
| *H03K 19/17736* | (2020.01) | |
| *G06F 30/33* | (2020.01) | |
| *G06F 30/327* | (2020.01) | |

(52) U.S. Cl.
CPC .......... *G06F 30/394* (2020.01); *G06F 30/327* (2020.01); *G06F 30/33* (2020.01); *H03K 19/1774* (2013.01); *H03K 19/1776* (2013.01); *H03K 19/17744* (2013.01)

(58) Field of Classification Search
CPC ...... G06F 30/327; G06F 30/33; G06F 30/394; G06F 15/8038; G06F 30/3947; G06F 30/3953; H03K 19/1776; H03K 19/17744
USPC ......................................... 716/129, 126, 130
See application file for complete search history.

(56) References Cited

U.S. PATENT DOCUMENTS

| | | | |
|---|---|---|---|
| 2004/0153849 A1* | 8/2004 | Tucker | G06F 13/4031 714/43 |
| 2006/0215588 A1* | 9/2006 | Yoon | H04W 40/10 370/310 |
| 2007/0220522 A1 | 9/2007 | Coene et al. | |
| 2008/0112415 A1* | 5/2008 | Sobaje | H04L 47/10 370/392 |
| 2012/0002550 A1* | 1/2012 | Cugini | H04L 45/24 370/238 |
| 2015/0058270 A1* | 2/2015 | Kawata | G06N 5/022 706/46 |
| 2016/0335207 A1* | 11/2016 | Dobbs | G06F 15/8038 |
| 2017/0206669 A1* | 7/2017 | Saleemi | G06T 7/292 |
| 2017/0220499 A1 | 8/2017 | Gray | |

* cited by examiner

*Primary Examiner* — Paul Dinh
(74) *Attorney, Agent, or Firm* — Patterson + Sheridan, LLP

(57) ABSTRACT

Some examples described herein relate to routing in routing elements. In an example, a design system includes a processor and a memory, storing instruction code, coupled to the processor. The processor is configured to execute the instruction code to model a communication network comprising switches interconnected in an array of data processing engines (DPEs), generate global routes of nets in the modeled communication network, generate detailed routes of the nets using the global routes, and translate the detailed routes to a file. Each of the switches has multiple input or output channels connected to another switch that are modeled as a single input or output edge, respectively, connected to the other switch. Each global route is generated through edge(s) of the switches. Each detailed route is generated comprising identifying one of the multiple input or output channels modeled by each edge through which the respective global route is generated.

20 Claims, 8 Drawing Sheets

US 10,963,615 B1

DATA PROCESSING ENGINE (DPE) ARRAY ROUTING

TECHNICAL FIELD

This disclosure relates to compiling at least some of an application for execution in an array of data processing engines (DPEs) on an integrated circuit and, more particularly, to routing of nets of the application in the array of DPEs.

BACKGROUND

A programmable integrated circuit (IC) refers to a type of IC that includes programmable circuitry. An example of a programmable IC is a field programmable gate array (FPGA). An FPGA is characterized by the inclusion of programmable circuit blocks. Circuit designs may be physically implemented within the programmable circuitry of a programmable IC by loading configuration data, sometimes referred to as a configuration bitstream, into the device. The configuration data may be loaded into internal configuration memory cells of the device. The collective states of the individual configuration memory cells determine the functionality of the programmable IC. For example, the particular operations performed by the various programmable circuit blocks and the connectivity between the programmable circuit blocks of the programmable IC are defined by the collective states of the configuration memory cells once loaded with the configuration data.

Circuit designs could be created by generating circuits using primitives and/or writing hardware description language (HDL) code. Configuration data is then generated from the primitives and/or HDL, including placing logic and routing between the placed logic. Various verification and validation methods could be implemented to ensure the proper functioning of the circuit design.

SUMMARY

Some examples described herein relate to routing in routing elements (e.g., switches). The routing elements can be or be included in, for example, a data processing engine (DPE) array, programmable logic (e.g., fabric in a field programmable gate array (FPGA)), nodes in a communication network, or other elements. Some examples can generate routes between the routing elements, and more particularly, can generate such routes faster than traditional routers.

In an example, a design system includes a processor and a memory coupled to the processor. The memory stores instruction code. The processor is configured to execute the instruction code to model a communication network comprising switches interconnected in an array of data processing engines (DPEs), generate global routes of nets in the modeled communication network, generate detailed routes of the nets using the global routes, and translate the detailed routes to a file. Each of the DPEs includes a hardened processor core, a memory module, and one or more of the switches. Each of the switches has multiple input or output channels connected to another switch that are modeled as a single input or output edge, respectively, connected to the other switch. Each global route is generated through one or more edges of the switches. Each detailed route is generated comprising identifying one of the multiple input or output channels modeled by each edge through which the respective global route is generated.

An example is a method for compiling. The method is performed by a processor-based system. Global routes of nets are generated in a communication network. The communication network includes switches interconnected in an array of DPEs. Each of the DPEs includes a hardened processor core, a memory module, and one or more of the switches. Each of the switches has multiple input or output channels connected to another switch that are modeled as a single input or output edge, respectively, connected to the other switch. Each global route is generated through one or more edges of the switches. Detailed routes of the nets are generated using the global routes. Each detailed route is generated comprising identifying one of the multiple input or output channels modeled by each edge through which the respective global route is generated. The detailed routes are translated to a file.

In an example, a design system includes a processor and a memory coupled to the processor. The memory stores instruction code. The processor is configured to execute the instruction code to generate global routes of nets in a communication network, generate detailed routes of the nets using the global routes, and translate the detailed routes to a file. The communication network includes switches interconnected in an array of DPEs. Each of the DPEs includes a hardened processor core, a memory module, and one or more of the switches. Each of the switches has multiple input or output channels connected to another switch that are modeled as a single input or output edge, respectively, connected to the other switch. Each global route is generated through one or more edges of the switches. Generating the global routes includes using an integer linear programming (ILP) algorithm. Each detailed route is generated comprising identifying one of the multiple input or output channels modeled by each edge through which the respective global route is generated.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Figure 1:
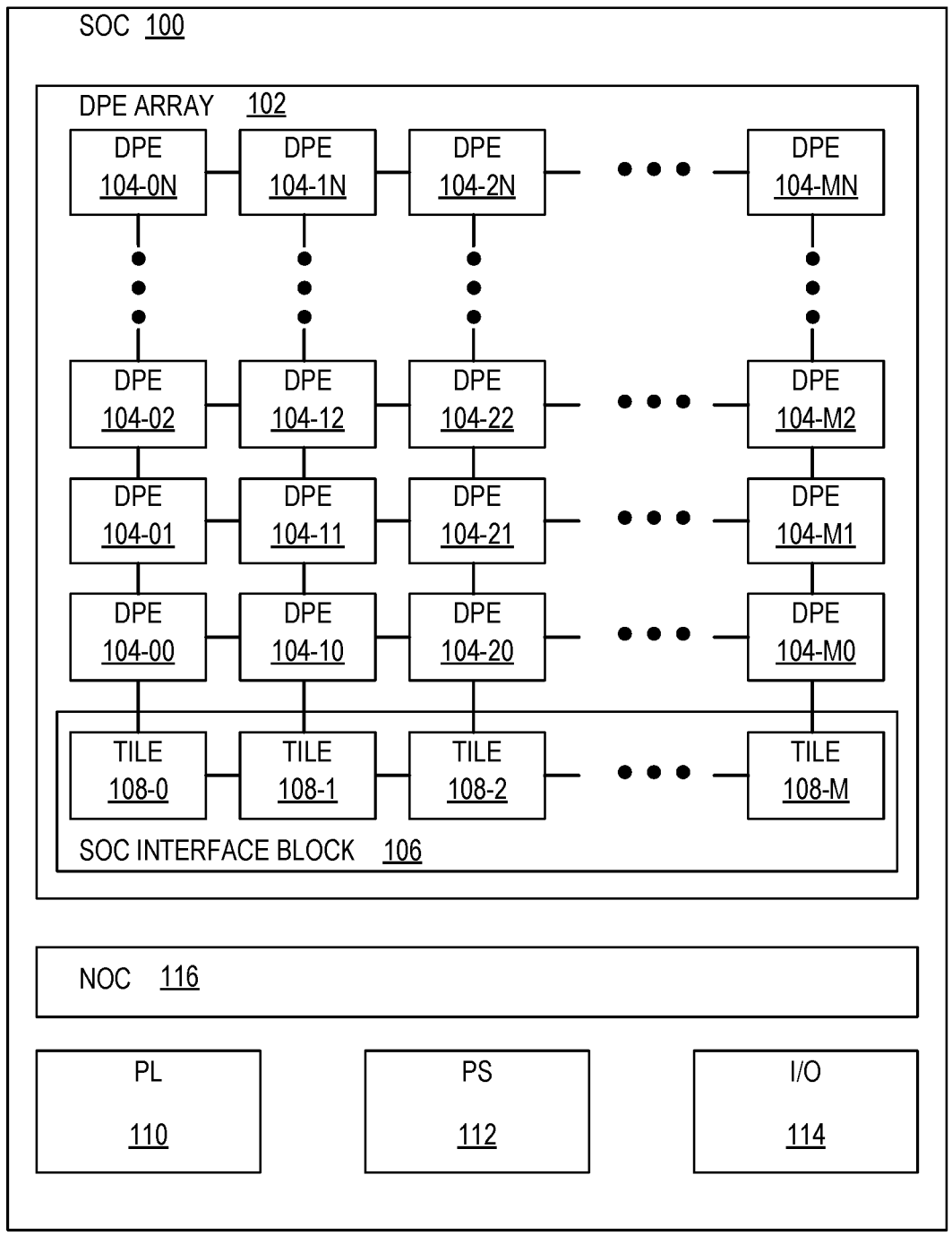
FIG. 1 depicts an architecture for a System-on-Chip (SoC) according to some examples.

Some examples described herein relate to compiling at least some of an application for a data processing engine (DPE) array of an integrated circuit (IC). According to some examples, a DPE array refers to a plurality of hardwired circuit blocks. The plurality of circuit blocks may be programmable. A DPE array may include a plurality of DPEs and a System-on-Chip (SoC) interface block. In general, a DPE includes a hardened core that is capable of providing data processing capabilities. A DPE may also include a memory module that is accessible by the core. A DPE further may include a DPE interconnect. The DPE interconnect refers to circuitry that is capable of implementing communications with other DPEs of a DPE array and/or communications with different subsystems of the IC including the DPE array. The DPE array of an IC is provided herein as an example architecture for which an application can be compiled. Compiling for other architectures, with or without a DPE array, is also within the scope of other examples.

Even more specifically, some examples described herein relate to routing in routing elements, such as switches. The routing elements can be or be disposed in, for example, a DPE array, programmable logic (e.g., fabric in a field programmable gate array (FPGA)), nodes in a communication network, or other elements.

In some examples, global routes are generated for nets, and detailed routes are generated within the global routes for the nets. To generate the global routes, elements (e.g., switches) of a communication network can be modeled such that multiple input or output channels that interface between a pair of elements are collapsed into a single edge between the pair of elements. A cumulative capacity of the multiple channels can be assigned to the single edge. The global routes for nets are generated through various edges of the elements. The global routes can be generated using an integer linear programming (ILP) algorithm. The ILP algorithm can use an objective function that minimizes a sum of weighted route slacks of the nets. A route slack of a net can be a difference between (i) a routing distance between a destination element and a source element of the net and (ii) a Manhattan distance between the source element and the destination element of the net. The ILP algorithm can include various constraints, such as a constraint that the utilization of each edge does not exceed the cumulative capacity of that edge. The generation of the detailed routes includes identifying which of the multiple input or output channels of edges of elements in the corresponding global route are to be implemented as the respective detailed route. The generation of the detailed routes can use a greedy routing algorithm.

In some examples, the routes are generated for nets (e.g., of data flows) that represent data flows between kernels of an application that are mapped to various cores of the DPEs of the DPE array. The routing can be performed to compile at least some of the application. Depending on the implementation, some examples may route other paths.

Some examples described herein are described in the context of a heterogeneous data processing architecture. More specifically, for example, the architecture described below includes (i) programmable logic regions (e.g., fabric of an FPGA) that are capable of being configured to process data, (ii) a processing system, and (iii) DPEs, each with a core, that are also capable of being programmed to process data. Some examples can be extended to homogeneous data processing architectures, such as, for example, multi-core processors (e.g., without programmable logic regions). Such multi-core processors can have a large number of resources available for executing an application and can benefit from aspects of examples described herein.

A heterogeneous data processing architecture such as described herein can permit execution of an application and communication across one or more programmable logic regions, a processing system, and a DPE array. Some examples described herein provide separate compiler modules on a processor-based system that are capable of compiling respective partitions of an application to generate binaries and bitstreams that are capable of being loaded onto and executed by an IC that implements a heterogeneous data processing architecture.

Due to the novelty of the heterogeneous data processing architecture described herein, no processor-based system (e.g., a computer) was available for compiling an application to be executed on an IC having the heterogeneous data processing architecture. An aspect of an architecture described herein is that a DPE array can be completely programmable, including a communication network through which cores of the DPE array can communicate. No compiler was previously available to compile an application that would generate binaries to program a communication network through which hardened (e.g., hardwired) processor cores were configured to communicate. Historically, hardened multi-processor cores would communicate via sharing a memory space and not through a programmable network. Accordingly, a technical problem existed in that no processor-based system was available to compile an application to be executed by an IC having the heterogeneous data processing architecture. Some examples provide a solution to this problem by implementing separate compiler modules on a processor-based system, at least one of which is capable of generating and compiling routes between hardened cores of the DPE array.

Techniques and processor-based systems for routing between placed logic in programmable logic of programmable logic devices (e.g., fabric of an FPGA) have been implemented previously. However, these techniques and processor-based systems have proven to be problematic when translating and modifying them to routing within a DPE array as described herein. An architecture described herein can be highly complex and large. The complexity and scale of the architecture could cause modifications of previous techniques and processor-based systems to not converge on a solution or to time out before a solution could be obtained. Additionally, a routing resource in this architecture may be capable of being shared by multiple routes or nets. No previous technique or processor-based systems could account for a routing resource that could be shared by a route. Previous techniques or processor-based systems were premised on one routing resource permitting only one route. Accordingly, a technical problem existed in that no processor-based system was available to route within a DPE array of an architecture as described herein. Some examples provide a solution to this problem by implementing global routing and detailed routing. Global routing can use a simplified model of a complex network, and detailed routing can identify specific channels within respective global routes. The global and detailed routing breaks routing into multiple operations where each operation can be simplified.

Some examples use an ILP algorithm for the global routing. Some examples use a greedy routing algorithm for the detailed routing. Implementations of such examples were capable of routing much faster than modifications of prior techniques and processor-based systems, if modifications of prior techniques and processor-based systems were able to converge on a solution.

Aspects of these and other examples are described below. Additional or other benefits may be achieved by various examples, as a person having ordinary skill in the art will readily understand upon reading this disclosure.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations. Even further, various directions or orientations are described as, e.g., a column and a row; horizontal and vertical; and bottom or below, top or above, left, and right. These designations are for ease of description, and other directions or orientations may be implemented.

FIG. 1 illustrates an architecture for a System-on-Chip (SoC) 100 according to some examples. The architecture of FIG. 1 and following figures is provided as an example to illustrate aspects of further examples below. The architecture can be modified with any number of variations, some of which may be identified in the following description.

The SoC 100 includes a DPE array 102. The DPE array 102 is includes a plurality of interconnected DPEs 104-00 through 104-MN (collectively or individually, DPE(s) 104). Each of the DPEs 104 is a hardwired circuit block and may be programmable. The DPE array 102 further includes a SoC interface block 106 that includes tiles 108-O through 108-M (collectively or individually, tile(s) 108). Each of the tiles 108 of the SoC interface block 106 may be hardwired and programmable. The SoC interface block 106 provides an interface between DPEs 104 of DPE array 102 and other portions (e.g., subsystems) of the SoC 100.

In the example of FIG. 1, the DPE array 102 includes a two-dimensional array of DPEs 104 and the SoC interface block 106. The DPE array 102 may be implemented using any of a variety of different architectures. FIG. 1 illustrates DPEs 104 arranged in aligned rows and aligned columns. The DPE array 102 has M+1 columns of DPEs 104 and N+1 rows of DPEs 104. The reference numerals of the DPEs 104 in FIG. 1 indicate the positioning of each DPE 104 by the reference number "104-[column][row]." In some examples, DPEs 104 may be arranged where DPEs 104 in selected rows and/or columns are horizontally inverted or flipped relative to DPEs 104 in adjacent rows and/or columns. In other examples, rows and/or columns of DPEs 104 may be offset relative to adjacent rows and/or columns. The DPEs 104 may be implemented as generally described in further detail below.

DPEs 104 are interconnected by DPE interconnects, which, when taken collectively, form a DPE interconnect network. Each DPE 104 is connected to vertically neighboring DPE(s) 104 and horizontally neighboring DPE(s) 104. For example, DPE 104-11 is connected to vertically neighboring DPEs 104 within column 1, which are DPEs 104-10 and 104-12, and is connected to horizontally neighboring DPEs 104 within row 1, which are DPEs 104-01 and 104-21. DPEs 104 at a boundary of the DPE array 102 may be connected to fewer DPEs 104. Additional details of these connections are described below. Other connections can be implemented, such as in different architectures of the DPE array 102.

In some examples, the SoC interface block 106 is coupled to adjacent DPEs 104. For example, as illustrated in FIG. 1, the SoC interface block 106 may be connected to each DPE 104 in the bottom row of DPEs 104-x0 in the DPE array 102 (where "x" indicates a given column). More particularly, in FIG. 1, each tile 108 of the SoC interface block 106 is connected to a neighboring DPE 104 within the column of the DPE array 102 in which the respective tile 108 is disposed. In FIG. 1, tile 108-O is connected to DPE 104-00; tile 108-1 is connected to DPE 104-10; tile 108-2 is connected to DPE 104-20; etc. Additionally, each tile 108 is connected to neighboring tiles 108. The SoC interface block 106 is capable of communicating data through the tiles 108, e.g., of propagating data from tile 108-O to tile 108-1, from tile 108-1 to tile 108-2, etc., and vice versa. A tile 108 within the SoC interface block 106 can communicate with a DPE 104 to which the tile 108 is connected, and the communication can be routed through the DPE interconnect network formed by the interconnected DPEs 104 to a target DPE 104.

The SoC interface block 106 is capable of coupling the DPEs 104 within DPE array 102 with one or more other subsystems of the SoC 100. For example, in FIG. 1, the SoC 100 includes programmable logic (PL) 110, a processor system (PS) 112, input/output blocks (I/O) 114, and a Network-on-Chip (NoC) 116. The SoC 100 can further include any other hardwired circuit blocks. Each of the PL 110, PS 112, I/O 114, and any other hardwired circuit blocks can be interconnected via the NoC 116. The SoC interface block 106 is capable of establishing connections between any of the DPEs 104 and the PL 110. The SoC interface block 106 is also capable of establishing connections between any of the DPEs 104 and the NoC 116. Through the NoC 116, the DPEs 104 are capable of communicating with the PS 112, I/O 114, and/or other hardwired circuit blocks. In some examples, DPEs 104 are capable of communicating with hardwired circuit blocks via the SoC interface block 106 and the PL 110. In some examples, the SoC interface block 106 may be connected to one or more subsystems of the SoC 100. For example, the SoC interface block 106 may be connected to the PS 112, I/O 114, and/or to other hardwired circuit blocks.

The NoC 116 is programmable to establish connectivity between different master circuits and different slave circuits of a user circuit design. The NoC 116 may be programmed by loading configuration data into internal configuration registers that define how elements within the NoC 116, such as switches and interfaces, operate to pass data from switch to switch and among the NoC interfaces. The NoC 116 may be programmed to route data, e.g., application data and/or configuration data, among the master and slave circuits of the user circuit design.

The PL 110 is circuitry that may be programmed to perform specified functions. As an example, the PL 110 may be implemented as FPGA circuitry. The PL 110 may include an array of programmable circuit blocks. Examples of programmable circuit blocks within the PL 110 include input/output blocks (IOBs), configurable logic blocks (CLBs), random access memory blocks (BRAM), digital signal processing blocks (DSPs), clock managers, and/or delay lock loops (DLLs). Each programmable circuit block within the PL 110 typically includes both programmable interconnect circuitry and programmable logic circuitry. The programmable interconnect and programmable logic circuitries may be programmed by loading configuration data into internal configuration memory cells that define how the programmable elements are configured and operate. Any number of different sections of PL 110 may be implemented in the SoC 100.

The PS 112 may be implemented as, or include, any of a variety of different processor types. For example, the PS 112 may be implemented as an individual processor, e.g., a single core capable of executing program code. In another example, the PS 112 may be implemented as a multi-core processor. In still another example, the PS 112 may include one or more cores, modules, co-processors, interfaces, and/or other resources. The PS 112 may be implemented using any of a variety of different types of architectures. Example architectures that may be used to implement the PS 112 may include an ARM processor architecture, an x86 processor architecture, a graphics processing unit (GPU) architecture, a mobile processor architecture, a DSP architecture, or other suitable architecture that is capable of executing computer-readable instruction code or program code.

The I/O 114 can be implemented as eXtreme Performance Input/Output (XPIO), multi-gigabit transceivers (MGTs), or any other input/output blocks. Other circuit blocks may be implemented as any of a variety of different hardwired circuit blocks. For example, Analog-to-Digital Converters (ADC), Digital-to-Analog Converters (DAC), or other circuits can be implemented.

The DPEs 104 can communicate various data by different mechanisms within the DPE array 102. As described in detail below, DPEs 104 are interconnect by a stream network of the DPE interconnect that includes interconnected stream switches. Application data and direct memory accesses (DMAs) may be communicated between the DPEs 104 via the stream network. The DPEs 104 are also interconnected by a memory mapped network of the DPE interconnect that includes interconnected memory mapped switches. Configuration and control data can be communicated between the DPEs 104 via the memory mapped network. Neighboring DPEs 104 can further communicate via shared memory. An independent cascade stream can be implemented between DPEs 104.

The SoC interface block 106 is an interface between the DPEs 104 and (i) the PL 110 and (ii) the NoC 116. Each tile 108 can service a subset of DPEs 104 in the DPE array 102. In the example of FIG. 1, each tile 108 services the column of DPEs 104 above the respective tile 108. The tiles 108 also include stream switches, which are interconnected in the stream network to stream switches of the DPEs 104, and memory mapped switches, which are interconnected in the memory mapped network to memory mapped switches of the DPEs 104. Communications from DPEs 104 can be communicated with the tile 108 below the respective DPEs 104 via the interconnected stream switches and/or memory mapped switches. The tile 108 can provide an interface to the PL 110 and/or the NoC 116 for communicating the communications thereto. The stream switches of the tiles 108 are also interconnected together in the stream network, and the memory mapped switches of the tiles 108 are interconnected together in the memory mapped network. Hence, communications can be propagated along the tiles 108 to a tile 108 that services a target DPE 104.

Generally, DPEs 104 and tiles 108 may be programmed by loading configuration data into configuration registers that define operations of the DPEs 104 and tiles 108. The configuration data may be programmed in the configuration registers by memory mapped transactions, such as through the memory mapped network.

Using a DPE array as described herein in combination with one or more other subsystems provides heterogeneous processing capabilities of the SoC 100. The SoC may have increased processing capabilities while keeping area usage and power consumption low. For example, the DPE array 102 may be used to hardware accelerate particular operations and/or to perform functions offloaded from one or more of the subsystems of the SoC 100. When used with a PS 112, for example, the DPE array 102 may be used as a hardware accelerator. The PS 112 may offload operations to be performed by the DPE array 102 or a portion thereof. In other examples, the DPE array 102 may be used to perform computationally resource intensive operations such as generating digital pre-distortion to be provided to analog/mixed signal circuitry.

Figure 2:
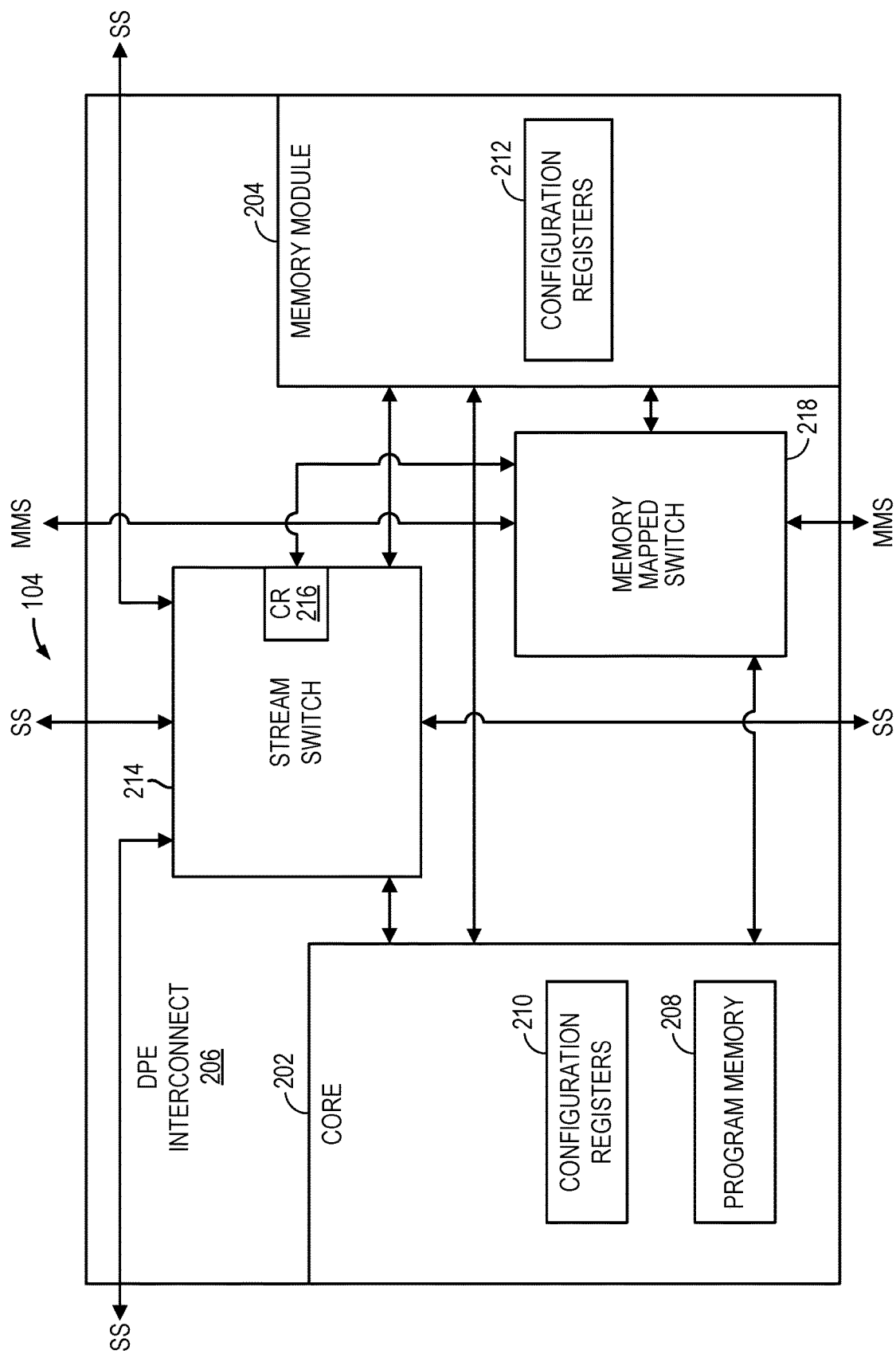
FIGS. 2 and 3 depict an architecture for a data processing engine (DPE) according to some examples.

FIG. 2 illustrates an architecture for a DPE 104 according to some examples. In the example of FIG. 2, DPE 104 includes a hardened core 202, a memory module 204, and DPE interconnect 206.

The core 202 provides the data processing capabilities of DPE 104. The core 202 may be implemented as any of a variety of different processing circuits. In some examples, core 202 is implemented as a processor that is capable of executing program code, e.g., computer readable instruction code. Program memory 208 is included in the core 202 and is capable of storing instruction code that is executed by the core 202. The core 202, for example, may be implemented as a CPU, a GPU, a DSP, a vector processor, or another type of processor that is capable of executing instruction code. The core 202 may include configuration registers 210 that may be loaded with configuration data to control operation of core 202. In some examples, core 202 may be activated and/or deactivated based upon configuration data loaded into configuration registers 210. The program memory 208 and the configuration registers 210 are addressable using the memory mapped network of the DPE interconnect 206 described in greater detail below. Via the memory mapped network of DPE interconnect 206, for example, the program memory 208 and configuration registers 210 may be loaded with program code and configuration data, respectively.

The memory module 204 is capable of storing data (e.g., application data) that is used by and/or generated by core 202. The memory module 204 may include a read/write memory such as a random-access memory. Accordingly, memory module 204 is capable of storing data that may be read and consumed by core 202 and data (e.g., results) that are written by core 202. As described in further detail below, the memory module 204 may implement shared memory that is shared between neighboring cores 202. The memory module 204 may include configuration registers 212 that may be loaded with configuration data to control operation of the memory module 204. The configuration registers 212 are addressable (e.g., may be read and/or written) via the memory mapped network of DPE interconnect 206 described in greater detail below.

The DPE interconnect 206 in the DPE 104 facilitates various operations including communication with one or more other DPEs and/or with other subsystems of the SoC 100. The DPE interconnect 206 further enables communication of configuration and control data with the DPE 104. In some examples, the DPE interconnect 206 is implemented as an on-chip interconnect. An example of an on-chip interconnect is an Advanced Microcontroller Bus Architecture (AMBA) eXtensible Interface (AXI) bus (e.g., or switch), although other interconnect circuitry, such as other types of buses, crossbars, and/or other types of switches, may be implemented.

The DPE interconnect 206 includes a stream network and a memory mapped network. The stream network is capable of exchanging data (e.g., application data) with other DPEs of DPE array 102 and/or other subsystems of the SoC 100. The memory mapped network is capable of exchanging data such as configuration and control data for the DPE(s).

The stream network of DPE interconnect 206 includes a stream switch 214 in each DPE 104, and stream switches 214 of DPEs are interconnected in forming the stream network. Although not specifically illustrated, each stream switch 214 includes stream interfaces, each of which is connected to another component (which may also have a stream interface) with which the stream switch 214 communicates. Each stream interface may include one or more masters (e.g., master interfaces or outputs) and/or one or more slaves (e.g., slave interfaces or inputs). Each master may be an independent output having a particular bit-width. For example, each master included in a stream interface may be an independent AXI master. Each slave may be an independent input having a particular bit-width. For example, each slave included in a stream interface may be an independent AXI slave.

The stream switch 214 is used to communicate with other DPEs in DPE array 102 and/or with the SoC interface block 106. For example, the stream switch 214 can communicate with a stream switch ("SS") in a DPE 104 or tile 108 in the SoC interface block 106 in each cardinal direction—e.g., to the left, above, right, and below. The stream switch 214 can also communicate with the core 202. The core 202 can therefore communicate with other DPEs 104 via the stream switch 214 of the DPE interconnect 206. The stream switch 214 can also communicate with the memory module 204. Other DPEs 104 can communicate with the memory module 204 via the stream switch 214 of the DPE interconnect 206. The stream switch 214 is capable of allowing non-neighboring DPEs to communicate with the core 202 and/or the memory module 204 via the interconnected stream switches 214 of the DPE interconnect network. The stream switch 214 may include configuration registers ("CR") 216 to which configuration data may be written via the memory mapped network of DPE interconnect 206. The configuration data can dictate which other DPEs and/or subsystems (e.g., the PL 110 and/or the PS 112) the DPE 104 can communicate with via the stream switch 214 and can dictate operation of the stream switch 214 (e.g., establishing circuit-switched point-to-point connections or packet-switched connections).

The memory mapped network of DPE interconnect 206 includes a memory mapped switch 218 in each DPE 104, and memory mapped switches 218 of DPEs are interconnected in forming the memory mapped network. Although not specifically illustrated, each memory mapped switch 218 includes memory mapped interfaces, each of which is connected to another component (which may also have a memory mapped interface) with which the memory mapped switch 218 communicates. In some examples, each memory mapped interface may include one or more masters (e.g., master interfaces or outputs) and/or one or more slaves (e.g., slave interfaces or inputs). Each master may be an independent output having a particular bit-width. For example, each master included in a memory mapped interface may be an independent AXI master. Each slave may be an independent input having a particular bit-width. For example, each slave included in a memory mapped interface may be an independent AXI slave.

The memory mapped switch 218 is used to exchange configuration and control data for DPE 104. The memory mapped switch 218 is capable of receiving configuration data that is used to configure DPE 104. The memory mapped switch 218 may receive configuration data from a memory mapped switch ("MMS") of a DPE located below DPE 104 and/or from a tile 108 in the SoC interface block 106. The memory mapped switch 218 is capable of forwarding received configuration data to a memory mapped switch ("MMS") of another DPE above DPE 104, to program memory 208 and/or configuration registers 210 within the core 202, to memory and/or configuration registers 212 in the memory module 204, and/or to configuration registers 216 within the stream switch 214.

The DPE interconnect 206 is coupled to the DPE interconnect 206 of each neighboring DPE 104 and/or tile 108 of the SoC interface block 106 depending upon the location of DPE 104. Taken collectively, DPE interconnects 206 of DPEs 104 form a DPE interconnect network (which may include the stream network and the memory mapped network).

In some examples, the DPE array 102 is mapped to the address space of the PS 112. Accordingly, any configuration registers and/or memories within any DPE 104 may be accessed via a memory mapped interface. For example, memory in the memory module 204, the program memory 208, configuration registers 210 in the core 202, configuration registers 212 in the memory module 204, and/or configuration registers 216 in the stream switch 214 may be read and/or written via the memory mapped switch 218. In some examples, subsystems of the SoC 100 are capable of reading the internal state of any register and/or memory element of any DPE 104 via the memory mapped switches. Through memory mapped switches, subsystems of the SoC 100 are capable of reading and/or writing to program memory 208 and to any configuration registers within DPEs 104.

Stream interfaces of the stream switch 214 are capable of providing deterministic throughput with a guaranteed and fixed latency from source to destination. In some examples, each stream interface that communicates with the DPE 104 to the left or to the right is capable of receiving four 32-bit streams (e.g., four input channels) and outputting four 32-bit streams (e.g., four output channels). In some examples, the stream interface that communicates with the DPE 104 or tile 108 below (e.g., in the architecture of FIG. 1) is capable of receiving six 32-bit streams (e.g., six input channels) and outputting four 32-bit streams (e.g., four output channels). In some examples, the stream interface that communicates with the DPE above (e.g., in the architecture of FIG. 1) is capable of receiving four 32-bit streams (e.g., four input channels) and outputting six 32-bit streams (e.g., six output channels). The numbers of streams and sizes of the streams of each stream interface are provided for purposes of illustration.

The stream switch 214 can be configurable to operate in a packet-switching mode or a circuit-switching mode. The mode can be controlled by writing to configuration registers 216 of the stream switch 214. In the circuit-switching mode, each port of the stream switch 214 is capable of servicing one data flow (e.g., one net is capable of being routed through each port). In the packet-switching mode, multiple data flows can share a port of the stream switch 214 (e.g., multiple nets are capable of being routed through each port). In some examples, a port can be shared by four data flows in the packet-switching mode.

Figure 3:
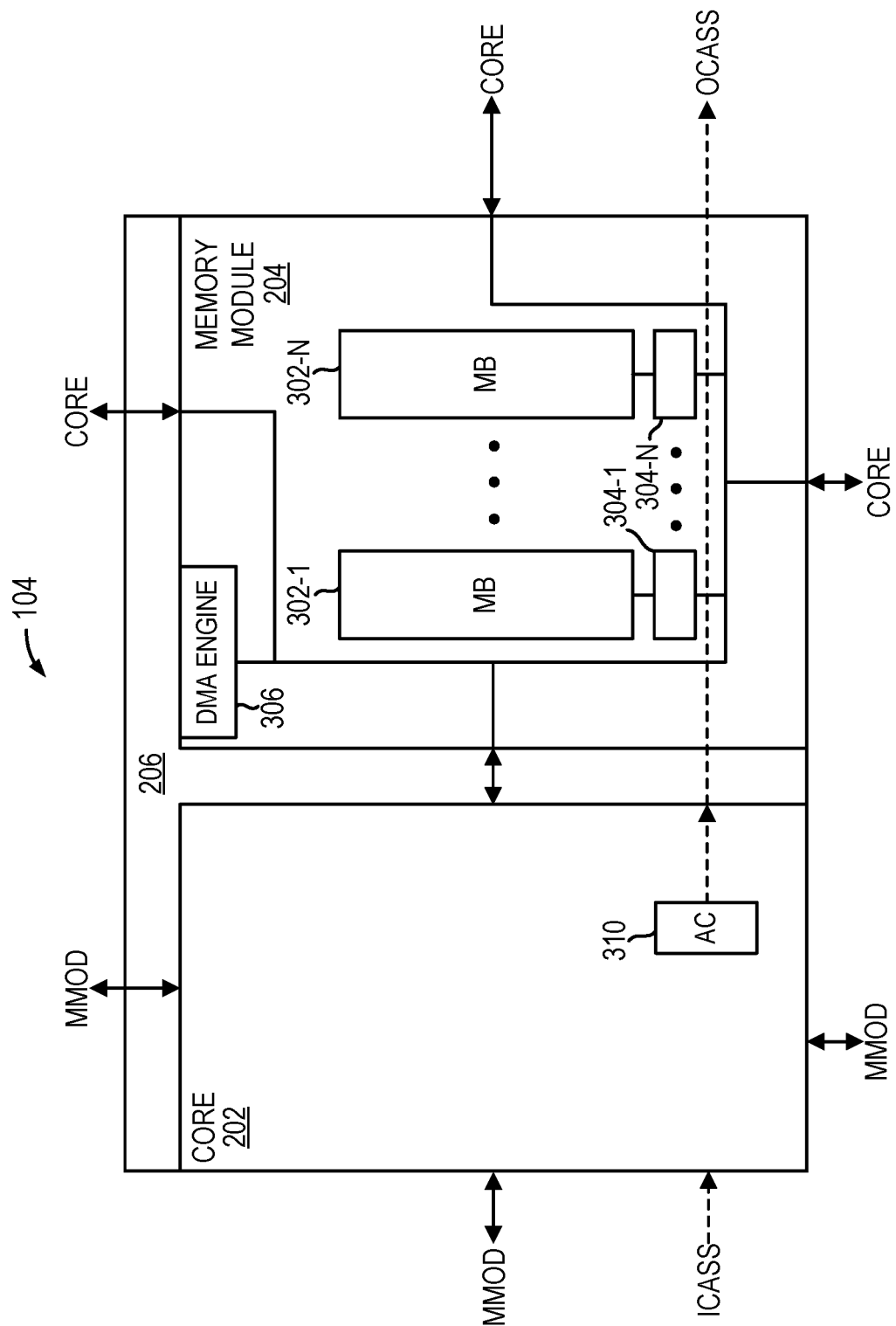

FIG. 3 illustrates further aspects of the architecture of FIG. 2 according to some examples. In FIG. 3, details relating to the DPE interconnect 206 are not shown. FIG. 3 illustrates aspects of memory module 204 and connectivity of the core 202 with other DPEs through shared memory.

The memory module 204 includes memory banks 302-1 to 302-N. In some examples, each memory bank 302 is single-ported thereby allowing up to one access to each memory bank each clock cycle. In other examples, each memory bank 302 is dual-ported or multi-ported thereby allowing a larger number of parallel accesses each clock cycle. Each of memory banks 302-1 through 302-N has an arbiter 304-1 through 304-N. Each arbiter 304 may include arbitration logic. Further, each arbiter 304 may include a crossbar. As noted in connection with FIG. 2, memory module 204 may include a memory mapped interface (not shown) that communicates with the memory mapped switch 218. The memory mapped interface in the memory module 204 may read and/or write to the memory bank 302 via the arbiters 304. Hence, the memory mapped switch 218 is capable of writing data to memory banks 302. As such, the particular data stored in memory module 204 may be controlled, e.g., written, as part of a configuration and control process.

Although not specifically illustrated, the memory module 204 includes memory interfaces, each of which is capable of communicating with a core ("CORE") neighboring the memory module 204. The memory module 204 is capable of operating as a shared memory that may be accessed by multiple DPEs. In the orientation of the example of FIG. 3, cores 202 of the illustrated DPE 104 and DPEs 104 above, to the right, and below the illustrated DPE 104 (e.g., cores that share a boundary with the memory module 204) can access the memory banks 302 through arbiters 304. Accordingly, in the example of FIG. 3, each core 202 or DPE 104 that has a shared boundary with the memory module 204 is capable of reading and writing to memory banks 302. If the orientation of the DPE 104 differs, orientations of cores that are capable of accessing the memory module 204 can differ.

Although not specifically illustrated, the core 202 includes core interfaces, each of which is capable of communicating with a memory module ("MMOD") neighboring the core 202. The core 202 is capable of accessing memory modules of other neighboring DPEs. In the orientation of the example of FIG. 3, the core 202 of the illustrated DPE 104 can access the memory modules of the illustrated DPE 104 and DPEs 104 above, to the left, and below the illustrated DPE 104 (e.g., memory modules that share a boundary with the core 202). Accordingly, in the example of FIG. 3, the core 202 is capable of reading and writing to any of the memory modules of DPEs that share a boundary with the core 202. The core 202 is capable of directing the read and/or write requests to the appropriate memory module based upon the addresses that are generated. If the orientation of the DPE 104 differs, orientations of memory modules that are capable of being accessed the core 202 can differ.

The memory module 204 further includes DMA engine 306. In some examples, DMA engine 306 includes one or more interfaces (e.g., stream interface) capable of (i) receiving input data streams from the stream switch 214 of the DPE interconnect 206 and writing the received data to memory banks 302, and (ii) reading data from memory banks 302 and sending the data out via the stream switch 214 of the DPE interconnect 206. Through DMA engine 306, application data may be received from other sources (e.g., other subsystems or any DPE 104) within the SoC 100 and stored in the memory module 204. Through DMA engine 306, data may be read from the memory banks 302 of memory module 204 and sent to other destinations (e.g., other subsystems or any DPE 104).

The DMA engine 306 may be programmed by the memory mapped switch 218 within the DPE 104. For example, DMA engine 306 may be controlled by configuration registers 212. Streams received via the stream switch 214 within the DPE interconnect 206 may be connected to the DMA engine 306 in memory module 204 and/or to the core 202 depending upon the configuration data loaded into configuration registers 210, 212, and/or 216. Streams may be sent from the DMA engine 306 (e.g., memory module 204) and/or core 202 depending upon the configuration data loaded into configuration registers 210, 212, and/or 216.

Although not specifically illustrated, the core 202 may also include cascade interfaces, each of which is capable of providing direct communication with another core. The core 202 receives an input data stream ("ICASS") directly from the core of the DPE to the left of the illustrated DPE 104. The received data stream may be provided to the data processing circuitry within core 202. The core 202 is capable of sending an output data stream ("OCASS") directly to the core of the DPE to the right of the illustrated DPE 104. Each cascade interface may include a first-in-first-out (FIFO) interface for buffering. A cascade interface is capable of outputting to another core the contents of an accumulator register ("AC") 310 in the core 202 and may do so each clock cycle. Accumulator register 310 may store data that is generated and/or being operated upon by data processing circuitry within core 202. The cascade interfaces may be programmed based upon configuration data loaded into configuration registers 210 (e.g., activated or deactivated). In some other examples, the cascade interfaces are controlled by the core 202. For example, the core 202 may include instruction code to read/write to the cascade interface(s).

Figure 4:
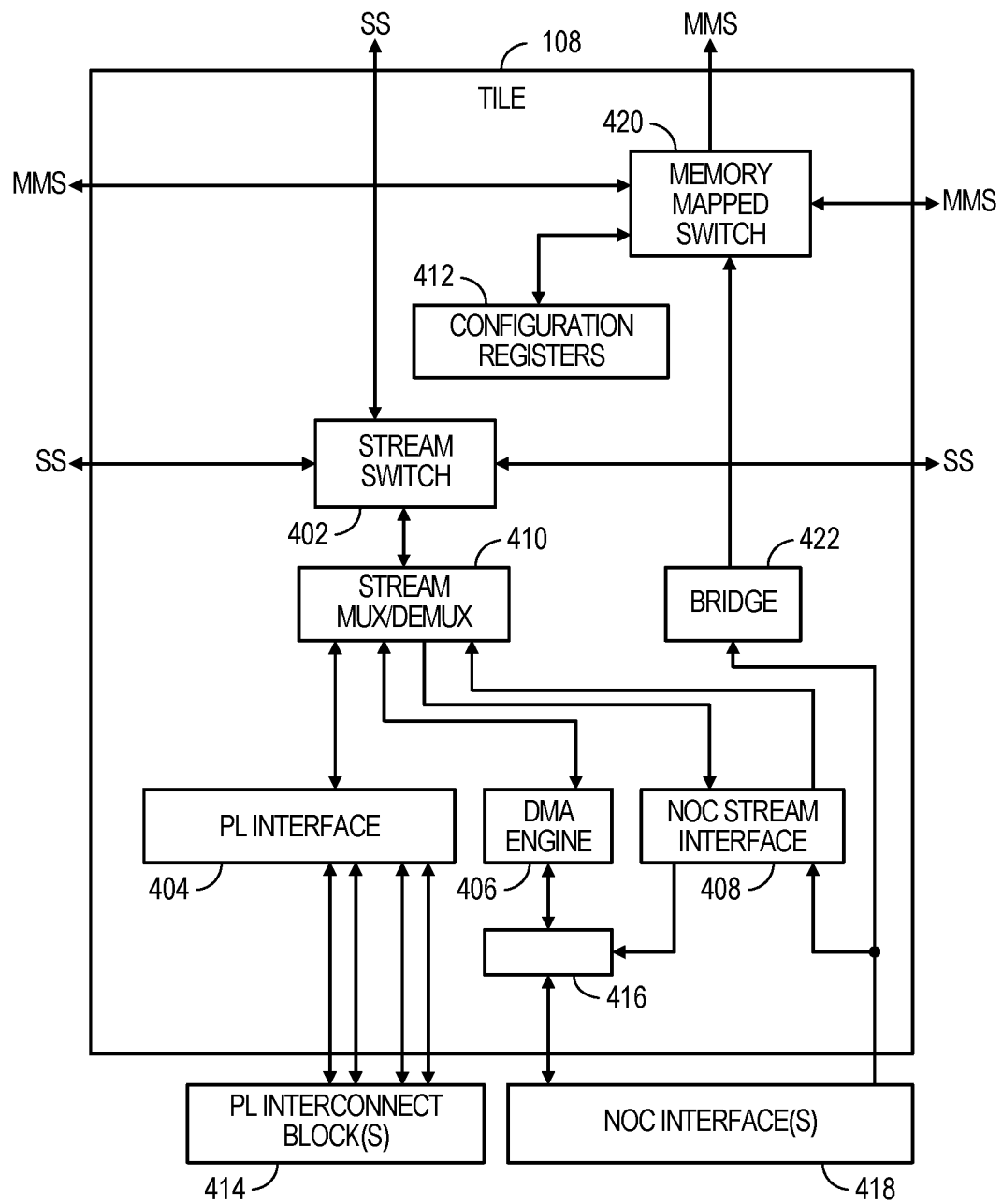
FIG. 4 depicts an architecture for a tile of a SoC interface block according to some examples.

FIG. 4 illustrates an example architecture for a tile 108 of the SoC interface block 106. In other implementations of a tile 108, a tile 108 may include additional or less circuitry and/or functionality. The tile 108 includes a stream switch 402 that includes stream interfaces, each of which is connected to another component (which may also have a stream interface) with which the stream switch 402 communicates. Stream switch 402 is connected horizontally to respective stream switches ("SS") in neighboring tiles 108 and vertically to a stream switch ("SS") in a neighboring DPE 104. Stream switches in neighboring tiles 108 are capable of exchanging data horizontally. The stream switch 402 is capable of communicating with the DPE 104 immediately above the tile 108. The stream switch 402 is also connected to and may communicate with a PL interface 404, a DMA engine 406, and/or to a NoC stream interface 408 via a stream multiplexer/demultiplexer ("stream mux/demux") 410.

The stream switch 402 is configurable by configuration data loaded into configuration registers 412. The stream switch 402, for example, may be configured to support packet-switched and/or circuit-switched operation based upon the configuration data. Further, the configuration data defines the particular DPE and/or DPEs within DPE array 102 to which stream switch 402 communicates.

The stream multiplexer/demultiplexer 410 is capable of directing data received from the PL interface 404, DMA engine 406, and/or NoC stream interface 408 to the stream switch 402. Similarly, the stream multiplexer/demultiplexer 410 is capable of directing data received from the stream switch 402 to the PL interface 404, DMA engine 406, and/or to NoC stream interface 408. The stream multiplexer/demultiplexer 410 may be programmed by configuration data stored in the configuration registers 412 to route selected data to the PL interface 404, to the DMA engine 406 where such data is sent over the NoC 116 as memory mapped transactions, and/or to the NoC stream interface 408 where the data is sent over the NoC 116 as a data stream.

The PL interface 404 couples to the PL 110 of the SoC 100 and provides an interface thereto. The PL interface 404 couples directly to one or more PL interconnect blocks 414 in the PL 110. In some examples, the PL interface 404 is further coupled to other types of circuit blocks and/or subsystems to be capable of transferring data between tile 108 and such other subsystems and/or blocks.

The DMA engine 406 is capable of operating to direct data into the NoC 116 through a selector block 416 and on to a NoC interface(s) 418. The DMA engine 406 is capable of receiving data from DPEs (via interconnected stream switches) and providing such data to the NoC 116 as memory mapped data transactions.

In some examples, the DMA engine 406 is capable of accessing an external memory. For example, DMA engine 406 is capable of receiving data streams from DPEs and sending the data stream to external memory through the NoC 116 to a memory controller located within the SoC. The memory controller then directs the data received as data streams to the external memory (e.g., initiates reads and/or writes of the external memory as requested by DMA engine 406). Similarly, DMA engine 406 is capable of receiving data from external memory where the data may be distributed to other tile(s) 108 of SoC interface block 106 and/or up into target DPEs 104.

The NoC stream interface 408 is capable of receiving data from the NoC 116 via the NoC interface(s) 418 and forwarding the data to the stream multiplexer/demultiplexer 410. The NoC stream interface 408 is further capable of receiving data from stream multiplexer/demultiplexer 410 and forwarding the data to NoC interface 418 through the selector block 416. The selector block 416 is configurable to pass data from the DMA engine 406 or from NoC stream interface 408 on to NoC interface(s) 418.

The tile 108 includes a memory mapped switch 420 that includes memory mapped interfaces, each of which is connected to another component (which may also have a memory mapped interface) with which the memory mapped switch 420 communicates. The memory mapped switch 420 connects vertically to the memory mapped switch ("MMS") of the DPE immediately above, which permits, for example, the memory mapped switch 420 to be capable of communicating with the column of DPEs above the tile 108. The memory mapped switch 420 connects horizontally to memory mapped switches ("MMS") in neighboring tiles 108, which permits, for example, the memory mapped switch 420 to be capable of moving data (e.g., configuration and control data) from one tile to another to reach a correct column of DPEs and direct the data to the target DPE within the column. The memory mapped switch 420 may also connect to configuration registers 412 within tile 108. Through memory mapped switch 420, configuration data may be loaded into configuration registers 412 to control various functions and operations performed by components within tile 108. The memory mapped switch 420 is coupled to NoC interface(s) 418 via bridge 422. The bridge 422 is capable of converting memory mapped data transfers from the NoC 116 (e.g., configuration and control data) into memory mapped data that may be received by memory mapped switch 420. Accordingly, the PS 112 or any other subsystem or circuit block can communicate with, e.g., a core 202 or memory module 204 of any DPE 104 via the interconnected memory mapped switches of the tiles 108 and DPEs 104.

Applications (e.g., a user design) can be designed, compiled, and instantiated on the SoC 100 based on the architecture described above or on other ICs based on other architectures. The applications can be compiled according to some examples. Examples described below provide for compiling an application including by mapping kernels to cores and routing nets. The routing of nets can be implemented by globally routing nets using an integer linear programming (ILP) algorithm and detailed routing nets in the global routes. Some examples can converge to a solution for routing nets in the above-described architecture much faster than a traditional router that has been modified for the above-described architecture.

Figure 5:
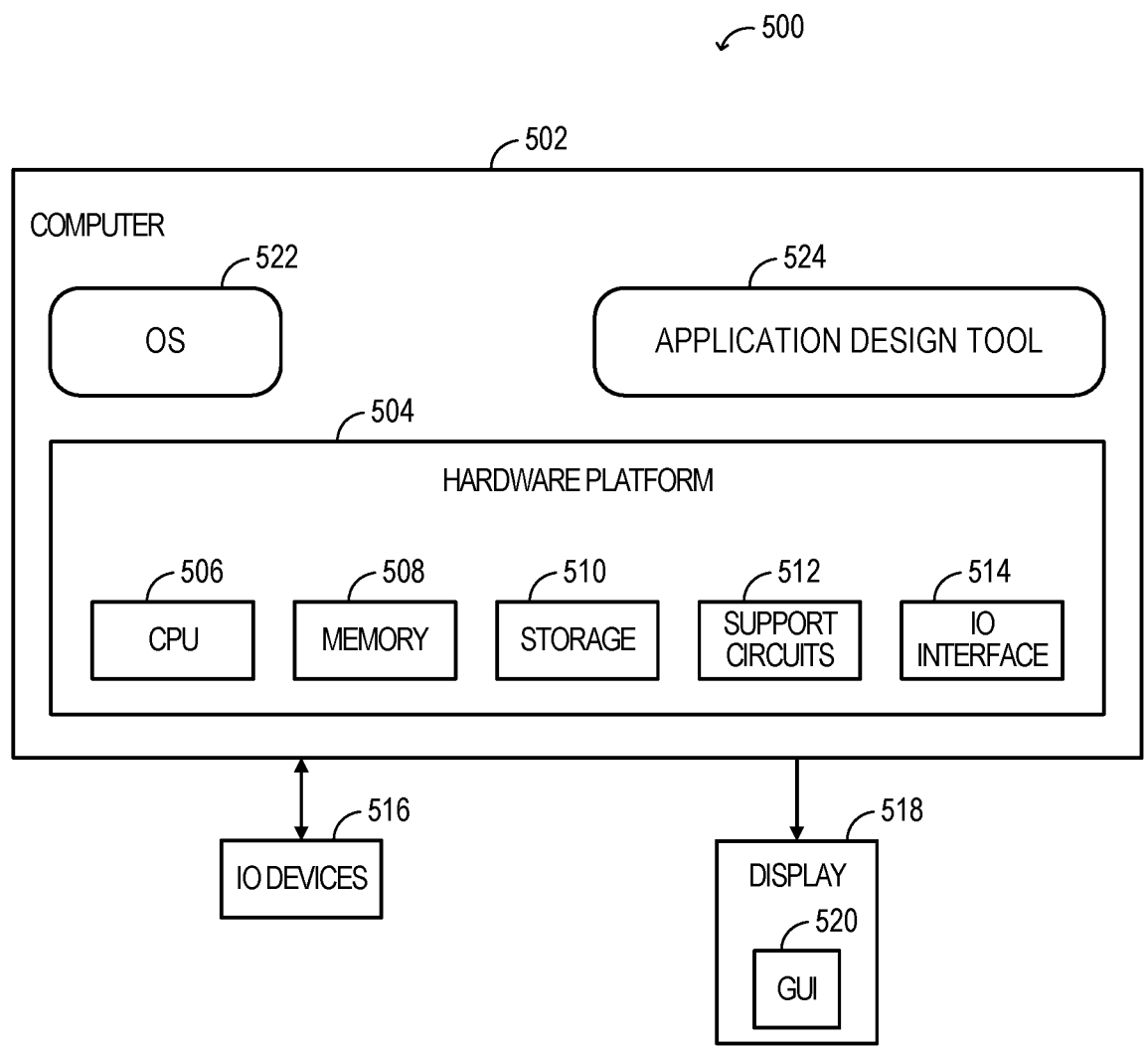
FIG. 5 is a block diagram depicting an example of an application design system in accordance with some examples.

FIG. 5 is a block diagram depicting an example of an application design system 500, in accordance with some examples. The application design system 500 (e.g., a processor-based system) can be used by a user to create an application that can be compiled and instantiated on the SoC 100 of FIG. 1, for example. The application design system 500 includes a computer 502 coupled to input/output (IO) devices 516 and a display 518. The computer 502 includes a hardware platform 504 that can include components of a computing device, such as a central processing unit (CPU) 506, system memory 508, storage 510, various support circuits 512, and an IO interface 514. The CPU 506 can include one or more microprocessors. The CPU 506 is configured to execute instruction code that performs one or more operations described herein. The instruction code can be stored in system memory 508, storage 510, or any other memory in the hardware platform 504 (e.g., cache memory). The system memory 508 includes one or more devices that store information and can include, for example, random access memory (RAM), read-only memory (ROM), or a combination thereof. The storage 510 includes one or more local storage devices, such as hard disks, flash memory modules, solid state disks, optical disks, and the like. The storage 510 can also include interface(s) configured for communication with one or more network data storage systems. The support circuits 512 can include cache, power supplies, clock circuits, data registers, IO interfaces, and the like. The IO interface 514 includes interfaces to/from the computer 502. The IO interface 514 can be coupled to the IO devices 516, which can include a keyboard, mouse, and the like. The IO interface 514 can also be coupled to the display 518, which can present a graphical user interface (GUI) 520 to a user.

The computer 502 further includes a software platform comprising an operating system (OS) 522 and an application design tool 524. The OS 522 and the application design tool 524 include instruction code that is executed by the CPU 506, which instruction code can be stored in system memory 508, storage 510, or any other memory. The OS 522 can include any known operating system, such as Linux®, Microsoft Windows®, Mac OS®, and the like. The application design tool 524 is an application that executes within the OS 522, which provides an interface to the hardware platform 504. Some operation of the application design tool 524 is described below.

Figure 6:
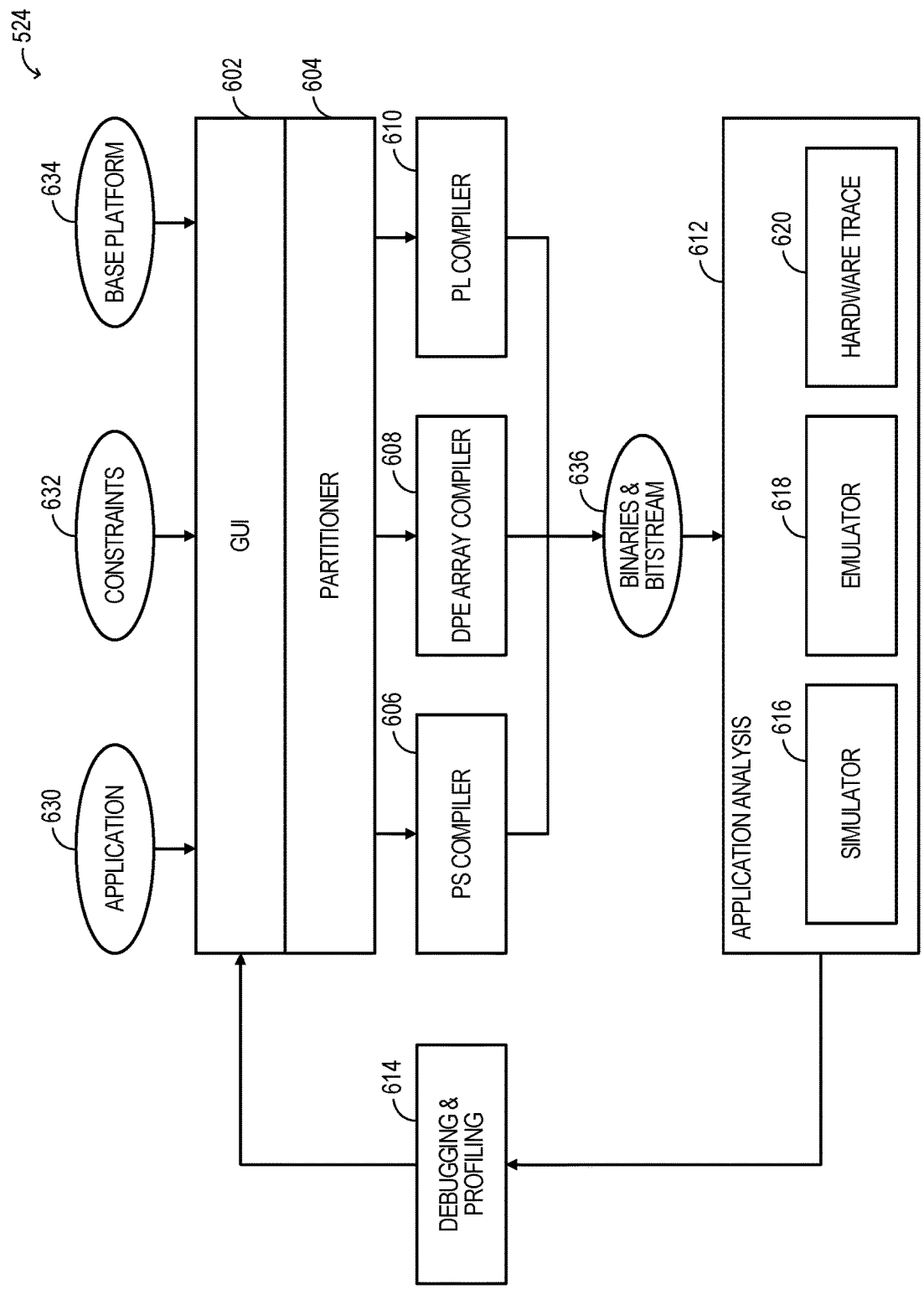
FIG. 6 is a block diagram depicting an application design tool capable of being implemented on the application design system of FIG. 5 according to some examples.

FIG. 6 is a block diagram depicting an application design tool 524 capable of being implemented on the application design system 500 of FIG. 5 according to some examples. The application design tool 524 includes a GUI module 602, a partitioner module 604, a PS compiler module 606, a DPE array compiler module 608, a PL compiler module 610, an application analysis module 612, and a debugging and profiling module 614. The application analysis module 612 includes a simulator module 616, an emulator module 618, and a hardware trace module 620. The modules 602-620 are just an example implementation of the application design tool 524. The functions performed by the modules 602-620 described herein can be performed by a different configuration of one or more modules in the application design tool 524. The modules 602-620 in the application design tool 524 can be implemented by circuitry that is part of an electronic system, by firmware in the electronic system, by software in the electronic system, or by a combination thereof.

The GUI module 602 provides an interface, via the GUI 520 and IO devices 516, for example, for a user to create an application 630. The application 630 can be a file including source code that defines the functionality of the application 630. The application 630 can be implemented according to a graph programming model. The application 630 can include kernel source code that defines kernels, and can define communication links (e.g., data flows) that link the kernels. The application 630 can be written in various types of object orientated programming languages (e.g., C++ or another language). An advantage of implementing a graph programming model for the application 630 is that a graph can have a highly parallelized architecture. In some examples, the semantics of the graph established by the application 630 is based upon the general theory of Kahn Process Networks which provides a computation model for deterministic parallel computation that is applied to the heterogeneous architecture in the SoC 100 (which includes different programmable architectures, e.g., the DPE array 102, the PS 112, and/or the PL 110).

Some constraints of the constraints file 632 can also be defined via the GUI module 602. The constraints can be user-defined, such as performance constraints and placement constraints, or pre-defined system constraints, such as constraints of the architecture like permissible number of data flows through a port of stream switch based on a mode, etc. User-defined constraints can be defined via the GUI module 602, for example. The constraints of the constraints file 632 can restrict some functionality to be performed within a defined latency, can restrict where various kernels can be placed in relation to another kernel, can restrict in which subsystem (e.g., the DPE array 102, the PS 112, or the PL 110) functionality can be mapped, etc., for example.

A base platform 634 can be a pre-defined class library that defines various functions, application programming interfaces (APIs), etc. that can be used by the application 630 via the GUI module 602. The application 630 (e.g., graph) can use various objects defined in the class library to call functionality in the application 630.

After creating the application 630, the application 630, constraints file 632, and base platform 634 are passed to the partitioner module 604. The partitioner module 604 partitions functionality of the application 630 to the different subsystems (e.g., the DPE array 102, the PS 112, or the PL 110). The partitioner module 604 can parse the application, e.g., based on the objects that are used to define different functions of the application 630 to partition the application 630 to the different subsystems.

The partitioned functionality is passed to the PS compiler module 606, the DPE array compiler module 608, and the PL compiler module 610. In some examples, a compiler may not be passed partitioned functionality if the application 630 does not include functionality to be mapped to the corresponding subsystem. The PS compiler module 606 compiles the functionality partitioned to the PS 112 and generates binaries from the compiling. The DPE array compiler module 608 compiles the functionality partitioned to the DPE array 102 (e.g., including mapping and routing) and generates binaries from the compiling. The PL compiler module 610 compiles the functionality partitioned to the PL 110 (e.g., including placing and routing) and generates a bitstream from the compiling. The compiling by any of the PS compiler module 606, the DPE array compiler module 608, and the PL compiler module 610 can be iteratively performed based on the compiling of any other of the PS compiler module 606, the DPE array compiler module 608, and the PL compiler module 610. For example, to meet some constraints, mapped functionality within the DPE array 102 may be re-mapped based on the placement of logic within the PL 110 to meet timing constraints between the DPE array 102 and the PL 110. The binaries and bitstream are assembled in a binaries and bitstream file 636 (e.g., a device programming image). The binaries and bitstream file 636 is capable of being loaded and instantiated on, e.g., the SoC 100 to implement the application 630 on the SoC 100.

The application analysis module 612 is then capable of determining performance indicators of the binaries and bitstream file 636 operating on the SoC 100. The simulator module 616 simulates the operation of the binaries and bitstream file 636 on the SoC 100, and the emulator module 618 emulates the operation of the binaries and bitstream file 636 on the SoC 100. The simulator module 616 can be a SystemC simulator, for example. The hardware trace module 620 is capable of, when communicatively coupled to the SoC 100, receiving trace information from the SoC 100 after the binaries and bitstream file 636 has been instantiated on the SoC 100 and the SoC 100 has performed operations according to the binaries and bitstream file 636.

Results of the application analysis module 612 are passed to the debugging and profiling module 614. The debugging and profiling module 614 can parse the results from the application analysis module 612 and display, via the GUI module 602, various events and performance metrics indicated by the results. The user can view the events and performance metrics via the GUI module 602 and GUI 520 on the display 518, for example, and can responsively and iteratively modify the application 630.

Figure 7:
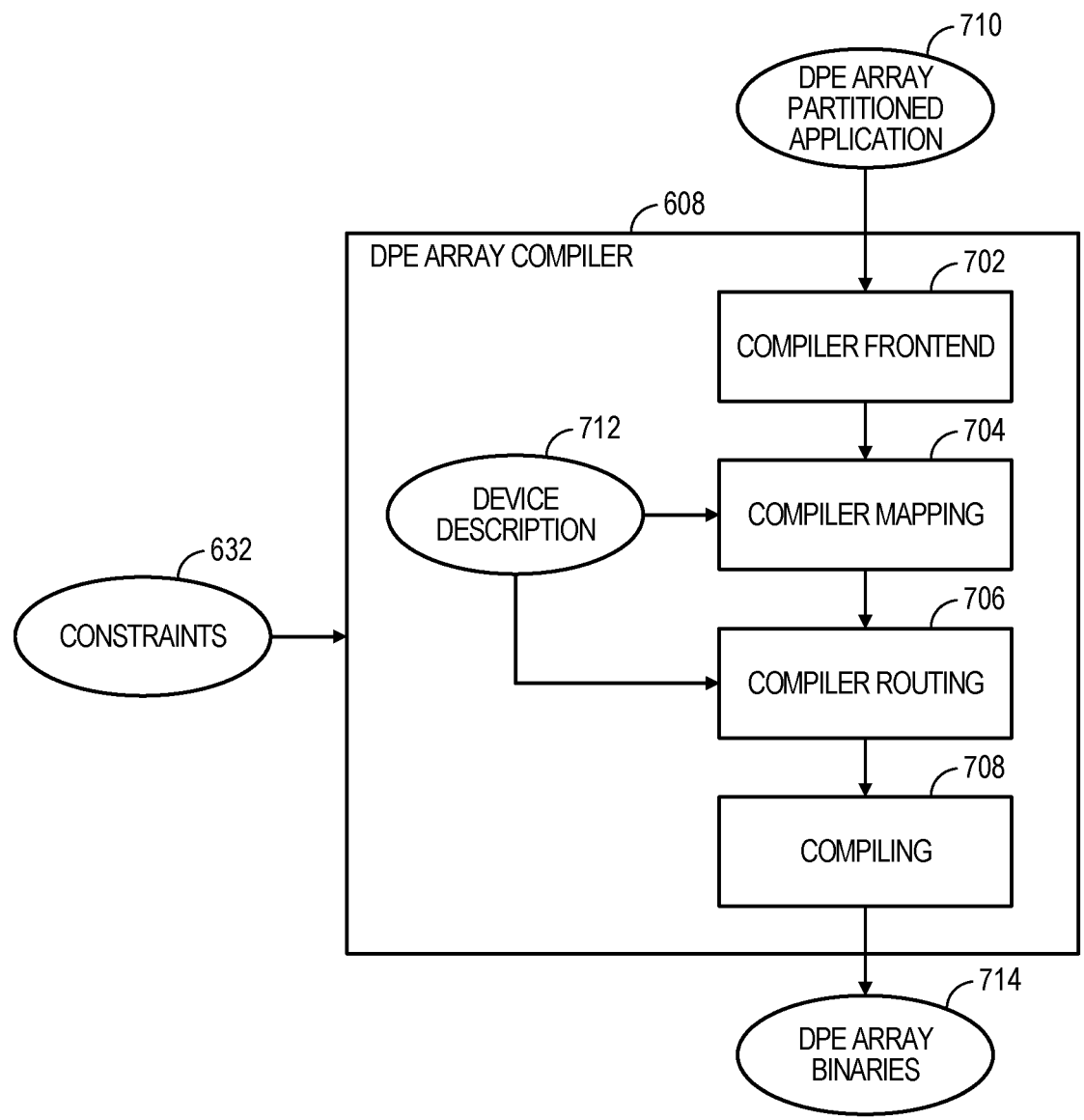
FIG. 7 is a block diagram depicting a DPE array compiler module of FIG. 6 according to some examples.

FIG. 7 is a block diagram depicting the DPE array compiler module 608 of FIG. 6 according to some examples. The DPE array compiler module 608 includes a compiler frontend module 702, a compiler mapping module 704, a compiler routing module 706, and a compiling module 708.

The DPE array compiler module 608 receives a DPE array partitioned application file 710 that includes kernels to be mapped to and instantiated on the DPE array 102. The DPE array partitioned application file 710 can be generated by the partitioner module 604 that partitions functionality of the application 630 to the different subsystems. The compiler frontend module 702 pre-processes the DPE array partitioned application file 710. For example, the processing can include identifying kernels that are to be mapped on different cores 202 of DPEs 104 and defining nets for data flows between the DPEs 104. The compiler frontend module 702 can generate a graph file (e.g., in a .json format) of the kernels and data flows.

The compiler mapping module 704 maps kernels to cores 202 of DPEs 104 and maps input/output nodes of the DPE array 102 to tiles 108 of the SoC interface block 106. The compiler mapping module 704 uses a device description file 712 that is a logical description of the architecture of the device (e.g., SoC 100) on which the application 630 is to be instantiated. Mapping by the compiler mapping module 704 identifies which elements in the device description file 712 corresponding to the DPE array 102 will implement which kernels or other functionality. The compiler mapping module 704 may use the constraints file 632 to ensure that where kernels and input/output nodes are mapped comply with constraints identified in the constraints file 632.

Mapping kernels to cores 202 can include minimizing data movements such as by mapping the kernels to cores 202 that permit communication via shared memory in a memory module 204 between the cores 202. When communication via shared memory is permitted, mapping can also map buffers to memory banks in a memory module 204 for shared memory communications. In some examples where a group of kernels are repeated in an application (e.g., in the graph file), mapping can identify a cluster of kernels and map that cluster onto cores 202 of DPEs 104. The mapping of the cluster of kernels can then be replicated to cores 202 of other DPEs 104 to map the kernels of the application. Mapping of input/output nodes to tiles 108 can include an iterative process communicating with the PL compiler module 610 and/or PS compiler module 606. For example, where input/output nodes are to be mapped to tiles 108 may correspond to a location where logic is placed and routed within the PL 110. Hence, coordination between the DPE array compiler module 608 and PL compiler module 610 may occur when placing logic in the PL 110 and/or mapping input/output nodes to tiles 108 of the SoC interface block 106 of the DPE array 102.

The compiler mapping module 704 creates a mapped array file having kernels mapped to various cores 202 of DPEs 104 and input/output nodes mapped to various tiles 108, and creates a netlist of nets for data flows between different kernels, between a kernel and a buffer (e.g., for DMA), and/or between a kernel and an input/output node. The mapped array file and netlist are output by the compiler mapping module 704 to the compiler routing module 706.

The compiler routing module 706 generates routes for nets (e.g., for data flows) through the stream network of the DPE array 102, including through stream switches 214 of DPEs 104 and stream switches 402 of tiles 108. The compiler routing module 706 uses the device description file 712 in generating the routes. The routing can be for streaming data flows of application data, for streaming DMAs between DPEs 104, or for other streaming data flows. The routes can be between various different cores 202 on which kernels are mapped, between various cores 202 on which kernels are mapped and memory modules 204 in different DPEs 104 (e.g., for streaming DMAs), between cores 202 on which kernels are mapped and mapped input/output nodes of tiles 108, and/or between other elements in the DPE array 102. The compiler routing module 706 may use the constraints file 632 to ensure that routes comply with constraints identified in the constraints file 632. Routing by the compiler routing module 706 and mapping by the compiler mapping module 704 may be iteratively performed to optimize a solution and/or to ensure compliance with constraints of the constraints file 632. Additional details of routing are described below for some examples. The compiler routing module 706 generates a translated netlist that includes the generated routes.

The compiling module 708 generates an executable DPE array binaries file 714 based on the processing by the compiler frontend module 702, the mapping by the compiler mapping module 704, and the routing by the compiler routing module 706. For example, the compiling module 708 may use the graph file, the mapped array file, and the translated netlist to compile binaries that are stored in the executable DPE array binaries file 714. The executable DPE array binaries file 714 is capable of being loaded into the DPE array 102 and executed by DPEs 104 and tiles 108 in the DPE array 102. The executable DPE array binaries file 714 can be part of the binaries and bitstream file 636 of FIG. 6.

Figure 8:
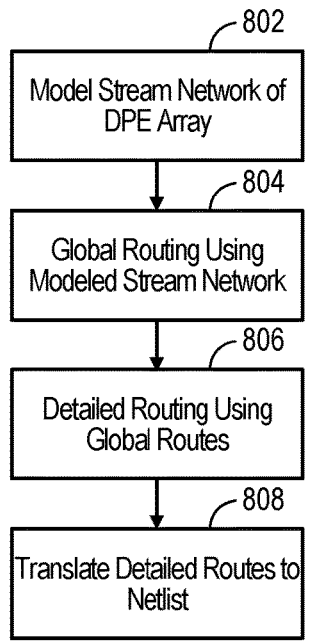
FIG. 8 is a flowchart of a method for routing according to some examples.

FIG. 8 is a flowchart of a method for routing by the compiler routing module 706 according to some examples. As described previously, the compiler routing module 706 receives a mapped array file and a netlist of nets that results from mapping. Routes are determined for the nets between the mapped cores 202 and/or input/output nodes of the tiles 108.

Figure 9:
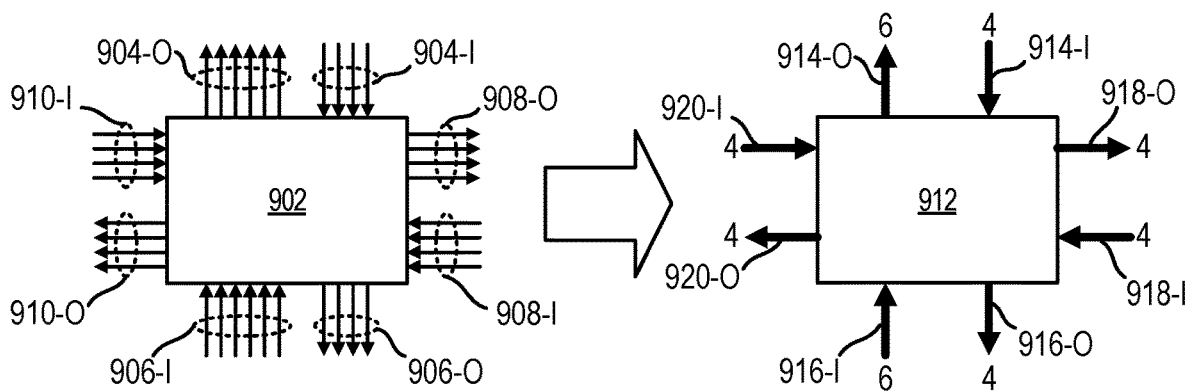
FIG. 9 is a diagram of modeling for a stream switch to a modeled stream switch according to some examples

At block 802, the stream network of the DPE array is modeled. According to some routing algorithms, the modeled stream network can be referred to as a graph; however, to avoid confusion with the graph model for programming the application, modeled stream network is used herein. The modeling of the stream network can be to simplify the routing algorithm. The modeling is based on the device description file 712. The modeling of the stream network can be by modeling each of the interconnected stream switches of the DPE array 102 (e.g., stream switches 214 of DPEs 104 and stream switches 402 of tiles 108). FIG. 9 illustrates a diagram of the modeling for a stream switch 902 (which may be in a DPE 104 or a tile 108) to a modeled stream switch 912 according to some examples. The modeled stream switch 912 is applied to each stream switch 214, 402 in the DPE array 102. The modeled stream switches are generally interconnected with collapsed edges as described below corresponding to the architecture indicated in the device description file 712 to form the modeled stream network.

The stream switch 902 interfaces with other elements (e.g., respective North, South, East, and West stream switches). Input channels and output channels of the stream switch 902 are illustrated, which can interface with output channels and input channels, respectively, of neighboring stream switches. As described previously and illustrated in FIG. 9, the stream switch 902 includes four input channels 904-I from above, six input channels 906-I from below, four input channels 908-I from the right, and four input channels 910-I from the left. The stream switch 902 includes six output channels 904-O to above, four output channels 906-O to below, four output channels 908-O to the right, and four output channels 910-O to the left. It is noted that the number of input channels and output channels can vary with differing architectures. Each channel can have some capacity, which may be defined by the architecture.

To model the stream switch 902, the multiple input or output channels for each edge of the stream switch 902 are collapsed into a single input or output edge, which is assigned a capacity that can have a correlation to the number of channels that were collapsed into that edge. For example, the capacity of any edge can be the cumulative capacity of the channels that were collapsed into that edge. If the capacities of the channels that are collapsed into an edge are equal, the cumulative capacity can be the number of channels that were collapsed into the edge multiplied by the capacity per channel of those channels. As shown in FIG. 9, the four input channels 904-I are collapsed to a single input edge 914-I that is assigned a cumulative capacity of the four input channels 904-I; the six input channels 906-I are collapsed to a single input edge 916-I that is assigned a cumulative capacity of the six input channels 906-I; the four input channels 908-I are collapsed to a single input edge 918-I that is assigned a cumulative capacity of the four input channels 908-I; and the four input channels 910-I are collapsed to a single input edge 920-I that is assigned a cumulative capacity of the four input channels 910-I. Also, the six output channels 904-O are collapsed to a single output edge 914-O that is assigned a cumulative capacity of the six output channels 904-O; the four output channels 906-O are collapsed to a single output edge 916-O that is assigned a cumulative capacity of the four output channels 906-O; the four output channels 908-O are collapsed to a single output edge 918-O that is assigned a cumulative capacity of the four output channels 908-O; and the four output channels 910-O are collapsed to a single output edge 920-O that is assigned a cumulative capacity of the four output channels 910-O.

By collapsing channels to single edges and assigning capacities as described, routing can be simplified. Implementing this modeling including assigning capacities can reduce the size of the stream network in which routes are generated. The reduced size can reduce the search space complexity of a routing algorithm and can permit scaling routing to a larger array size. Additionally, no potential solutions may be eliminated by implementing this modeling, and design and hardware constraints may not be violated by implementing this modeling.

Referring back to FIG. 8, in block 804, global routing is performed using the modeled stream network. The global routing can be performed using an integer linear programming (ILP) algorithm. With the nets from the netlist and kernels mapped to cores 202, the ILP algorithm can globally route the nets onto the edges of the modeled stream switches of the modeled stream network.

According to an example of the ILP algorithm described herein, some notation is identified.

B is a set of blocks within the modeled stream network, where b is any individual block within the set of B. Due to the one-to-one correspondence of stream switch to DPE 104 or tile 108, each block b can conceptually be the modeled stream switch 912 or can be the DPE 104 or tile 108 in which the modeled stream switch 912 is disposed.

N is the set of nets within the netlist file, where n is any individual net within the set of N.

e is an edge of a block b.

$v_{e\_n}$ is a Boolean variable (e.g., 0 or 1) for an edge e for a given net n. $v_{e\_n}$ is 1 when edge e is used by net n; otherwise, $v_{e\_n}$ is 0.

$p_{b\_n}$ is an integer variable that represents a routing distance between a block b and a source block $b_{src}$ for a given net n.

$v_{s\_n}$ is a route slack variable for a given net n, which may be an integer value. $v_{s\_n}$ is the difference between (i) the routing distance between the destination block $b_{dst}$ and the source block $b_{src}$ and (ii) a Manhattan distance between a source block $b_{src}$ and a destination block $b_{dst}$ for a given net n. $v_{s\_n}$ may be zero if the net n is routed using the shortest path.

For each block b in set B for a given net n in set N:
I(b) is the set of all incoming edges of block b;
O(b) is the set of all outgoing edges of block b;
$s_{Ib}$ is the sum of $v_{e\_n}$ for all incoming edges e in I(b) (e.g., $s_{Ib}$: sum($v_{e\_n}$: e in I(b)); and $s_{Ob}$ is the sum of $v_{e\_n}$ for all outgoing edges e in O(b) (e.g., $s_{Ob}$: sum($v_{e\_n}$: e in O(b)).

Additionally, some constraints may be defined that may be based on the architecture of the device and/or based on the application. The constraints may be defined in the constraints file 632, for example. For example, the architecture can permit any net to be a two-pin net or a broadcast net, and the application can determine which nets, if any, are two-pin nets or broadcast nets. A two-pin net has a single source block and a single destination block. A broadcast net has a single source block and multiple destination blocks.

For a two-pin net, for each block b in set B, $s_{Ib}$ and $s_{Ob}$ are each less than or equal to 1 (e.g., $s_{Ib} \leq 1$ and $s_{Ob} \leq 1$). Also, for a source block $b_{src}$ in set B, $s_{Ibsrc}$ is zero, and $s_{Obsrc}$ is one (e.g., $s_{Ibsrc}=0$ and $s_{Obsrc}=1$). For a destination block $b_{dst}$ in set B, $s_{Ibdst}$ is one, and $s_{Obdst}$ is zero (e.g., $s_{Ibdst}=1$ and $s_{Obdst}=0$). For other non-source and non-destination blocks b in set B, $s_{Ib}$ is equal to $s_{Ob}$ (e.g., $s_{Ib}=s_{Ob}$).

For a broadcast net, each block b in set B, $s_{Ib}$ is less than or equal to 1 (e.g., $s_{Ib} \leq 1$). Also, for a source block $b_{src}$ in set B, $s_{Ibsrc}$ is zero, and $s_{Obsrc}$ greater than or equal to one (e.g., $s_{Ibsrc}=0$ and $s_{Obsrc} \leq 1$). For a destination block $b_{dst}$ in set B, $s_{Ibdst}$ is one, and $s_{Obdst}$ is zero (e.g., $s_{Ibdst}=1$ and $s_{Obdst}=0$). For other non-source and non-destination blocks b in set B, $s_{Ib}$ is less than or equal to $s_{Ob}$ (e.g., $s_{Ib} \leq s_{Ob}$). For blocks b that are not a source block, if there is at least one output edge of the block b, the block b has an input edge (e.g., $s_{Ib} \geq v_{e\_n}$ for each outgoing edge e in O(b)).

Capacity of each edge e may also be a constraint. A constraint may account for total utilization of an edge by all nets n in set N such that the utilization of each edge e does not exceed the capacity of the respective edge e. The capacity for any edge e can be assigned as described above with respect to FIG. 9. According to some examples, the sum of $v_{e\_n}$ for all nets n in set N is less than or equal to the capacity of edge e (e.g., sum($v_{e\_n}$: for all nets n in set N) $\leq$ CAPACITY(e)).

A constraint may be included to prevent random cyclic paths in a route. The routing distance variables $p_{b\_n}$ may be used for this constraint. For each block pair (j, k) with a first edge $e_1$ from block j to block k and a second edge $e_2$ from block k to block j:

$$p_{j\_n}+v_{e1\_n} \leq p_{k\_n}+L_{max}*(1-v_{e1\_n})$$

$$p_{k\_n}+v_{e2\_n} \leq p_{j\_n}+L_{max}*(1-v_{e2\_n})$$

where $L_{max}$ may be some longest path length in the modeled stream network or some arbitrarily large number (e.g., 1000).

A constraint can relate the route slack variable $v_{s\_n}$ with a Manhattan distance $M_{DIST}$ between a source block $b_{src}$ and a destination block $b_{dst}$ in a net n. This constraint may be applied to a two-pin net (e.g., and not to a broadcast net). For a two-pin net with a source block $b_{src}$ and a destination block $b_{dst}$, and with a Manhattan distance $M_{DIST}$:

$$p_{bdst\_n}-p_{bsrc\_n} \leq M_{DIST}+v_{s\_n}$$

which, assuming $p_{bsrc\_n}$ to be 0, can be simplified to:

$$p_{bdst\_n} \leq M_{DIST}+v_{s\_n}$$

Having established some variables and constraints, an objective function can be defined. In some examples, minimum length routes (subject to various constraints) may be a target for generating the routes. Hence, in such examples, the objective function can minimize paths for the routes given the various constraints. In an example, the objective function is:

Min(sum($v_{s\_n}$*ROUTE$_{S\_COST}$)) for all nets n in the set N. The variable ROUTE$_{S\_COST}$ can be a constant used to control a weight of the route slack variables $v_{s\_n}$.

With constraints and objective function, the ILP algorithm globally routes nets on edges e of blocks b in the modeled stream network. The global routes determine on which edges (and, thereby, through which stream switches) a net is routed, and the global routes may not identify channels of stream switches through which the net is routed.

In block 806, detailed routing is performed using the global routes. The detailed routing routes the nets in the stream network of the architecture based on the global routes. The detailed routing identifies through which channel of a switch the net is routed. The global routing identifies an edge of a switch through which a net is routed, and the detailed routing identifies a channel of that edge through which the net is routed. The detailed routing for each net can therefore be a routing problem with a small search space and small complexity. In some examples, the detailed routing uses a greedy routing algorithm.

In block 808, the detailed routes that were generated in block 806 are translated to the netlist to generate the translated netlist. The translated netlist can include an identification of each stream switch and corresponding input channel and output channel that forms each net. The stream switches and channels of a net form a route for data flow. The translated netlist can then be used for compiling by the compiling module 708.

As will be appreciated by one having ordinary skill in the art, the examples disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects. Furthermore, aspects may take the form of a computer program product embodied in one or more non-transitory computer readable medium(s) having computer readable program code embodied thereon.

The computer readable medium may be a computer readable storage medium, for example. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

Computer program code for carrying out operations for aspects described herein may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of various examples have been described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instruction code. These computer program instruction code may be provided to a processor of a general purpose computer, special purpose computer, or other programmable data processing apparatus to produce a machine, such that the instruction code, which execute via the processor of the computer or other programmable data processing apparatus, create means for implementing the functions/acts specified in the flowchart and/or block diagram block or blocks.

These computer program instruction code may also be stored in a computer readable medium that can direct a computer, other programmable data processing apparatus, or other devices to function in a particular manner, such that the instruction code stored in the computer readable medium produce an article of manufacture including instruction code which implement the function/act specified in the flowchart and/or block diagram block or blocks.

The computer program instruction code may also be loaded onto a computer, other programmable data processing apparatus, or other devices to cause a series of operational steps to be performed on the computer, other programmable apparatus or other devices to produce a computer implemented process such that the instruction code which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods, and computer program products according to various examples. In this regard, each block in the flowchart or block diagrams may represent a module, segment, or portion of instruction code, which comprises one or more executable instruction code for implementing the specified logical function(s). In some implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instruction code.

While the foregoing is directed to specific examples, other and further examples may be devised without departing from the basic scope thereof, and the scope thereof is determined by the claims that follow.

What is claimed is:

1. A design system comprising:

a processor; and a memory coupled to the processor, the memory storing instruction code, the processor being configured to execute the instruction code to:

model a communication network comprising switches interconnected in an array of data processing engines (DPEs), each of the DPEs including a hardened processor core, a memory module, and one or more of the switches, each of the switches having multiple input or output channels connected to another switch that are modeled as a single input or output edge, respectively, connected to the other switch;

generate global routes of nets in the modeled communication network, each global route being generated through one or more edges of the switches;

generate detailed routes of the nets using the global routes, each detailed route being generated comprising identifying one of the multiple input or output channels modeled by each edge through which the respective global route is generated; and translate the detailed routes to a file.

2. The design system of claim 1, wherein generating the global routes uses an integer linear programming (ILP) algorithm.

3. The design system of claim 2, wherein the ILP algorithm includes an objective function that minimizes a sum of weighted route slacks of the nets, wherein a route slack of a net is a difference between (i) a routing distance between a destination element and a source element of the net and (ii) a Manhattan distance between the source element and the destination element of the net.

4. The design system of claim 2, wherein the ILP algorithm includes a constraint that utilization of each edge by the nets does not exceed a capacity of the respective edge.

5. The design system of claim 2, wherein the ILP algorithm includes a constraint that prevents cyclic routing of any of the global routes.

6. The design system of claim 1, wherein generating the detailed routes uses a greedy routing algorithm.

7. The design system of claim 1, wherein the processor is further configured to execute the instruction code to map kernels of an application to one or more hardened processor cores of the DPEs, respective ones of the global routes being generated between (i) different hardened processor cores to which kernels are mapped, (ii) a hardened processor core to which a kernel is mapped and a memory module, or (iii) a hardened processor core to which a kernel is mapped and an input/output element of the array, respective ones of the nets representing a data flow between (i) different kernels, (ii) a kernel and a buffer, or (iii) a kernel and an input/output node.

8. The design system of claim 1, wherein each of the switches includes two or more sides, each of the two or more sides having (i) multiple input channels connected to another switch that are modeled as a single input edge connected to the other switch and (ii) multiple output channels connected to the other switch that are modeled as a single output edge connected to the other switch.

9. A method for compiling, the method comprising:
by a processor-based system:

generating global routes of nets in a communication network, the communication network comprising switches interconnected in an array of data processing engines (DPEs), each of the DPEs including a hardened processor core, a memory module, and one or more of the switches, each of the switches having multiple input or output channels connected to another switch that are modeled as a single input or output edge, respectively, connected to the other switch, each global route being generated through one or more edges of the switches;

generating detailed routes of the nets using the global routes, each detailed route being generated comprising identifying one of the multiple input or output channels modeled by each edge through which the respective global route is generated; and translating the detailed routes to a file.

10. The method of claim 9, wherein generating the global routes uses an integer linear programming (ILP) algorithm.

11. The method of claim 10, wherein the ILP algorithm includes an objective function that minimizes a sum of weighted route slacks of the nets, wherein a route slack of a net is a difference between (i) a routing distance between a destination element and a source element of the net and (ii) a Manhattan distance between the source element and the destination element of the net.

12. The method of claim 10, wherein the ILP algorithm includes a constraint that utilization of each edge by the nets does not exceed a capacity of the respective edge.

13. The method of claim 10, wherein the ILP algorithm includes a constraint that prevents cyclic routing of any of the global routes.

14. The method of claim 9, wherein generating the detailed routes uses a greedy routing algorithm.

15. The method of claim 9, wherein each of the switches includes two or more sides, each of the two or more sides having (i) multiple input channels connected to another switch that are modeled as a single input edge connected to the other switch and (ii) multiple output channels connected to the other switch that are modeled as a single output edge connected to the other switch.

16. A design system comprising:
a processor; and
a memory coupled to the processor, the memory storing instruction code, the processor being configured to execute the instruction code to:

generate global routes of nets in a communication network, the communication network comprising switches interconnected in an array of data processing engines (DPEs), each of the DPEs including a hardened processor core, a memory module, and one or more of the switches, each of the switches having multiple input or output channels connected to another switch that are modeled as a single input or output edge, respectively, connected to the other switch, each global route being generated through one or more edges of the switches, generating the global routes including using an integer linear programming (ILP) algorithm;

generate detailed routes of the nets using the global routes, each detailed route being generated comprising identifying one of the multiple input or output channels modeled by each edge through which the respective global route is generated; and translate the detailed routes to a file.

17. The design system of claim 16, wherein the processor is configured to execute the instruction code to model the communication network including assigning a capacity to each edge corresponding to capacities of the multiple input or output channels of the respective edge.

18. The design system of claim 17, wherein the ILP algorithm includes a constraint that utilization of each edge by the nets does not exceed the capacity of the respective edge.

19. The design system of claim 16, wherein the ILP algorithm includes an objective function that minimizes a sum of weighted route slacks of the nets, wherein a route slack of a net is a difference between (i) a routing distance between a destination element and a source element of the net and (ii) a Manhattan distance between the source element and the destination element of the net.

20. The design system of claim 16, wherein generating the detailed routes uses a greedy routing algorithm.

* * * * *

UNITED STATES PATENT AND TRADEMARK OFFICE
CERTIFICATE OF CORRECTION

PATENT NO. : 10,963,615 B1
APPLICATION NO. : 16/399445
DATED : March 30, 2021
INVENTOR(S) : Abhishek Joshi et al.

Page 1 of 1

It is certified that error appears in the above-identified patent and that said Letters Patent is hereby corrected as shown below:

In the Specification

Column 20, Line 22, Delete "$s_{Obsrc} \leq 1$)." and insert -- $s_{Obsrc} \geq 1$). --, therefor.

Column 20, Line 25, Delete "$s_{Ib} \ S_{Ob}$" and insert -- $s_{Ib} \leq s_{Ob}$ --, therefor.

Column 20, Line 27, Delete "$s_{Ib} \ v_{e\_n}$" and insert -- $s_{Ib} \geq v_{e\_n}$ --, therefor.

Column 20, Lines 36-37, Delete "N) CAPACITY (e))." and insert -- N) $\leq$ CAPACITY (e)). --, therefor.

Signed and Sealed this
Fourteenth Day of September, 2021

Drew Hirshfeld
*Performing the Functions and Duties of the*
*Under Secretary of Commerce for Intellectual Property and*
*Director of the United States Patent and Trademark Office*